United States Patent
Dengler et al.

(10) Patent No.: US 6,420,450 B1
(45) Date of Patent: Jul. 16, 2002

(54) CATIONICALLY HARDENING MASS, THE USE THEREOF AND PROCESS FOR PREPARING HARDENED POLYMER MASSES

(75) Inventors: Dietmar Dengler; Michael Stumbeck, both of Landsberg (DE)

(73) Assignee: Delo Industrieklebstoffe GmbH & Co. KG (DE)

(*) Notice: Subject to any disclaimer, the term of this patent is extended or adjusted under 35 U.S.C. 154(b) by 0 days.

(21) Appl. No.: 09/593,890

(22) Filed: Jun. 14, 2000

(30) Foreign Application Priority Data

Jun. 18, 1999 (DE) .......................... 199 27 949

(51) Int. Cl.⁷ .................. C09J 163/00; C08L 63/00; C08J 3/28; C09D 163/00
(52) U.S. Cl. .................... 522/13; 522/15; 522/24; 522/25; 522/129; 522/146; 522/170; 522/181
(58) Field of Search ............... 522/13, 15, 24, 522/25, 170, 181, 129, 146

(56) References Cited

U.S. PATENT DOCUMENTS

| | | | |
|---|---|---|---|
| 4,238,587 A | 12/1980 | Crivello | 526/192 |
| 4,256,828 A | 3/1981 | Smith | 430/280 |
| 4,351,708 A * | 9/1982 | Berner et al. | |
| 4,374,751 A | 2/1983 | Dudgeon | 252/426 |
| 4,560,709 A * | 12/1985 | Berner et al. | |
| 4,593,051 A * | 6/1986 | Koleske | |
| 4,593,052 A | 6/1986 | Irving | 522/31 |
| 4,892,764 A * | 1/1990 | Drain et al. | |
| 5,227,627 A | 7/1993 | Herold et al. | 250/438 |
| 5,242,715 A | 9/1993 | Schoen et al. | 427/386 |
| 5,384,339 A * | 1/1995 | Starkey | |
| 5,445,855 A * | 8/1995 | Tokita et al. | |
| 5,516,813 A | 5/1996 | Starkey | 522/25 |
| 6,037,043 A | 3/2000 | Lehner et al. | 428/209 |
| 6,084,004 A * | 7/2000 | Weinmann et al. | |
| 6,245,827 B1 * | 6/2001 | Gregory | |

FOREIGN PATENT DOCUMENTS

| | | | |
|---|---|---|---|
| DE | 3007684 | 9/1981 | C08G/59/70 |
| DE | 2853886 | 4/1983 | B23B/27/04 |
| DE | 4304491 | 8/1994 | C09D/7/12 |
| DE | 4421623 | 4/1996 | C08G/59/68 |
| DE | 19534594 | 3/1997 | C08L/63/00 |
| DE | 19534664 | 3/1997 | C08L/63/00 |
| DE | 19534668 | 3/1997 | C08L/63/00 |
| DE | 19638630 | 4/1998 | B05D/5/12 |
| DE | 19705027 | 8/1998 | C09J/5/00 |
| EP | 0146501 | 6/1985 | C08G/85/00 |
| EP | 0431809 | 6/1991 | C09D/163/00 |
| EP | 0504569 | 9/1992 | B05D/1/00 |
| EP | 0508046 | 10/1992 | B01J/19/08 |
| EP | 0688804 | 12/1995 | C08G/59/68 |
| EP | 0 764 691 | 3/1997 | C08G/63/00 |
| EP | 1 092 740 | 4/2001 | C08G/59/24 |
| GB | 2070616 | 9/1981 | C08F/4/00 |
| NL | 9100226 | 9/1992 | C08G/77/42 |

* cited by examiner

Primary Examiner—Susan W. Berman
(74) Attorney, Agent, or Firm—Hayes Soloway P.C.

(57) ABSTRACT

Cationically hardening masses are described, which can be stored and handled as single-component masses and comprise at least one difunctional cationically polymerizable compound; a photo-initiator for the cationic hardening based upon diaryliodonium salts; at least one compound containing an hydroxyl group; a compound releasing radicals when heated and having a half-life of one hour at a temperature of less than 100° C.; a photo-initiator forming radicals or of a photo-sensitizing agent for diaryliodonium salts; and from 0 to 60 parts by mass of modifier. The compounds are used for bonding, casting, sealing and coating of substrates.

15 Claims, 9 Drawing Sheets

Hardening temperature for different peroxides

CATIONICALLY HARDENING MASS, THE USE THEREOF AND PROCESS FOR PREPARING HARDENED POLYMER MASSES

The invention relates to cationically hardening polymer masses, which can be stored in a stable manner for a duration of several months as single-component masses and which can be hardened by means of two different hardening mechanisms, a light-initiated and a heat-initiated hardening mechanism.

The invention relates in particular to those cationically hardening masses which can be hardened in a short time at low temperatures, but which at the same time have a satisfactory storage stability, and which can be used for the adhesion, casting, sealing and coating of substrates.

Finally, the invention relates to a process for preparing cationically hardened polymer masses from the cationically hardening masses according to the invention.

The light-initiated cationic polymerization of masses for adhesion, casting and sealing has been known for a long time. The hardened masses are characterized by a high degree of cohesion and an excellent adhesion capacity to a plurality of substrates. The wide range of application of the radiation-hardening masses is restricted, however, by the fact that in those cases of application in which the fluid masses can run or move into shadowed zones, hardening does not take place in the shadowed areas which are inaccessible to radiation. A considerable number of attempts has therefore been made to provide the cationic masses with a second hardening mechanism which will ensure a reliable hardening even in the shadowed areas.

In this way, cationically hardening epoxy masses are described in EP-A-0 688 804, which comprise the following constituents:

(1) Cationically polymerizable monomers containing epoxy groups;
(2) Lewis or Brønsted acids and/or compounds, which produce these acids under the action of light, and
(3) at least one of the further constituents: flexibilizing agents, retardants, radically polymerizable monomers, accelerators and/or modifiers such as dyes, pigments, fillers, reinforcement agents, thixotropic agents, initiators, stabilizers, inhibitors and bonding agents.

These known masses are extremely reactive, so that in the form of a single-component mixture, i.e. in the simultaneous presence of the constituents (1) to (3), they harden extremely rapidly in the presence of daylight and at room temperature and would have no storage stability. The constituents of these known masses must therefore be divided into at least two components in a defined manner and must be stored in this multi-component form. Only immediately before they are used in accordance with their purpose should the two or more components be mixed together and exposed to light and/or heat, after which they harden extremely rapidly. A special feature of these known masses is that one of the two components, which does not yet contain all the constituents, can be activated by radiation with light of a wavelength of from 280 to 650 nm and in this activated form can be stored in a stable manner for a duration of up to 90 days, as a result of which rapid hardening of the masses takes place even in the shadowed areas after the two or possibly more components have been combined.

A disadvantage of these known masses is the considerable outlay in terms of apparatus for a two- or multiple-component mixing unit required therefor as well as the greater outlay in terms of logistics for the separate storage of two or more components.

Cationically polymerizable masses are known from EP-A-0 508 046, which are completely exposed to light in a storage vessel and thus activated before their application. A disadvantage of this is that the volume of the mass respectively exposed in each case cannot be removed completely from the storage vessel and that the walls of the vessel build up at a greater or lesser rate of increase as a result of material hardening. A continuous manner of operation is not possible in this case.

Further hardening methods known from the field of adhesion, for example anaerobic hardening, moisture hardening, aerobic hardening, hardening by way of primers or activators, are not suitable for cationic polymerization. In the majority of publications which relate to the cationic hardening of polymer masses in areas inaccessible to light (shadowed zones), reaction mechanisms which are based on a heat-initiated hardening are therefore described.

DE-A-197 05 027 and 196 38 630 describe thermal initiators for cationic polymerization based upon thiolanium salts, which require long hardening times at a high temperature, however, for example 16 hours at 130° C. or 6 hours at 140° C. or 3 hours at 150° C. In addition, the poor availability and the high price of thiolanium salts are disadvantageous.

DE-A-30 07 684 and 28 53 886 disclose thermosettable compositions which, in addition to cationically polymerizable material and diaryliodonium salt, contain a copper chelate, optionally together with a reduction agent, or organic acids or anhydrides for cationic thermosetting. In this case, too, the long hardening time and the poor storage stability of the masses described are disadvantageous, as well as the toxicity of the copper compounds used, the blue-green colour, the poor solubility and the autocatalytic effect of the said copper compounds with respect to the light-induced decomposition of polymers.

Masses are known from EP-A-0 146 501 which contain aromatic iodosyl salts and metallic salts and/or peroxides as co-catalysts. The disadvantages of these masses are the high hardening temperatures, poor availability of the aromatic iodosyl salts and the toxicity of the metallic salts used.

Finally, cationically polymerizable masses based upon diaryliodonium salts are known from GB-A-2 070 616, which acquire a thermal hardening mechanism by way of dibenzyl compounds or oligomeric silyl ethers. The disadvantages of these masses are the high hardening temperatures of 140 or 160° C. as well as an only incomplete reaction of the cationically polymerizable groups.

Cationically hardening epoxy masses are known from U.S. Pat. No. 4,374,751, which consist of (1) an at least difunctional cationically polymerizable epoxy compound;
(2) a photo-initiator for the cationic hardening based upon diaryliodonium salts;
(3) a peroxide compound which releases radicals when heated, and
(4) optionally adjuvants and additives, such as for example fillers, dyes, pigments and agents for setting the viscosity.

These known masses can be stored in a stable manner under normal conditions and harden relatively slowly only after thermal activation at temperatures above 100° C., preferably at 150° C. (within 3.5 hours at 150° C. according to Example 1).

The object of the invention is to propose novel cationically hardenable masses which can be stored and handled in a stable manner as single-component masses for a duration of several months, and which can be completely hardened rapidly and at low temperatures which light-induced and/or heat-induced and can be hardened under gentle conditions even in shadowed zones inaccessible to radiation without a special outlay in terms of apparatus. In particular, the masses should be suitable for the adhesion of heat-sensitive electronic components during the assembly of printed-circuit boards (surface-mounted devices).

This object is attained according to the invention by the cationically hardening mass of claim 1; said mass consisting of:

(A) from 5 to 90 parts by mass of at least one difunctional cationically polymerizable compound;

(B) from 0.01 to 5 parts by mass of a photo-initiator for the cationic hardening based upon diaryliodonium salts;

(C) from 0.1 to 70 parts by mass of at least one compound containing an hydroxyl group and having a molar mass of from 150 to 10,000 g/mol and hydroxy-equivalent masses of from 50 to 5,000 g/mol;

(D) from 0.01 to 10 parts by mass of a compound releasing radicals when heated and having a half-life of one hour at a temperature of less than 100° C.;

(E) from 0.001 to 10 parts by mass of a photo-initiator forming radicals or of a photo-sensitizing agent for diaryliodonium salts, and (F) from 0 to 60 parts by mass of modifiers, selected from at least one of the groups of fillers, dyes, pigments, stabilizers, accelerators, retardants, initiators, flow promoters, thixotropifying agents, diluents and polymer thickening agents.

with the sum of all parts by mass amounting to 100 and all the constituents (A) to (F) of the cationically hardening mass being present in the form of a single-component mixture capable of being stored in a stable manner and the cationically hardening mass being completely hardenable when light-initiated and/or heat-initiated.

Preferred embodiments of the mass according to the invention are additionally characterized by the features of claims 2 to 9.

In addition, a subject of the invention is the use of the cationically hardening masses according to the invention for the adhesion, casting, sealing and coating of substrates, in particular electronic components, with which printed-circuit boards are equipped, the hardening of the adhesive mass preferably taking place only after the equipping or joining, both in the areas accessible to radiation and in the shadowed zones, in particular below the positioned components.

A subject of the invention is, in addition, a process for preparing cationically hardened polymer masses, in which a cationically hardening single-component mass is hardened according to the invention under the action of a wavelength of from 200 to 600 nm and/or with the application of heat, the cationically hardening mass being heated to at most 120° C.

Resins or cationically polymerizable monomers, such as for example multifunctional vinyl ethers and vinyl esters, are suitable as an at least difunctional, cationically polymerizable compound (constituent (A)) of the masses according to the invention. Suitable vinyl ethers are trimethylolpropane trivinyl ethers, ethylene glycol divinyl ethers and cyclic vinyl ethers. Compounds which are generally satisfactory are the vinyl esters and vinyl ethers of multifunctional alcohols, in which case polyethylene and polypropylene glycols having vinyl ether terminal groups, are preferably used. In addition, cationically polymerizable heterocyclic compounds, such as for example glycidyl ethers and β-methylglycidyl ethers of cycloaliphatic diols and polyols, are suitable. In addition, glycidyl compounds which can be used are the glycidyl esters of carboxylic acids, in particular of di- and polycarboxylic acids, for example the glycidyl esters of succinic acid, adipic acid and phthalic acid. Examples of particularly reactive glycidyl compounds are the diepoxides of vinyl cyclohexane and dicyclopentadiene as well as 3-(3',4'-epoxycyclohexyl)-8,9-epoxy-2,4-dioxyspiro(5.5)undecane and 3,4-epoxycyclohexylmethyl-3',4'-epoxycyclohexylcarboxylate. Preferred epoxy resins are optionally pre-lengthened and/or pre-polymeric diglycidyl ethers of bivalent phenols or bivalent aliphatic alcohols with from two to four C atoms. According to the invention, mixtures of different cationically polymerizable compounds can also be used.

According to the invention, the diaryliodonium salts (constituent (B)) used can be the salts of the formula in which $Ar^1$ and $Ar^2$, which can be the same or different, represent aromatic residues which can optionally be substituted differently, such as for example phenyl, naphthyl, alkyl phenyl and halogen phenyl, or in which $Ar^1$ and $Ar^2$ together signify a divalent residue of the formula in which $R^1$, independently of one another in each case, represents an alkyl or alkoxy group with from 1 to 4 C atoms, a nitro group or a halogen atom, Y represents an oxygen or sulphur atom or a methylene group, M represents one of the elements B, P, As, Sb, Sn or Bi, X represents fluorine, chlorine or pentafluorophenyl, and n=4, 5 or 6, but in each case is 1 higher than the valency of the element M.

The diaryliodonium salt preferably contains an anion with a nucleophilicity lower than the nucleophilicity of an $SbF_6^-$ anion; it is particularly preferred for it to contain tetrakispentafluorophenyl borate as the anion.)

It is particularly preferred for the constituent (B) of the masses according to the invention to be 4-methylphenyl[4-(1-methylethyl)phenyl]iodonium-tetrakispentafluorophenyl borate.

Polyester polyols, polyester butadiene diols and alkoxy-extended hydroxy aromatic compounds can be used as the compound (constituent (C)) containing an hydroxyl group, namely in each case with molar masses of from 150 to 10,000 g/mol, preferably of between 1,000 and 5,000 g/mol, and hydroxyl-equivalent masses of from 50 to 5,000 g/mol, preferably of from 500 to 2,000 g/mol.

The polyester polyols can be produced for example by polycondensation from low molecular polyols and polycarboxylic acids or the anhydrides thereof. Typical representatives of this class of compounds are available commercially under the name "Dynacoll"™ (manufacturer: Hüls).

Polyester polyols, which are obtainable by catalysed reactions of caprolactone with different starter alcohols, can likewise be used. Typical representatives of this class of compounds are available commercially under the name "Tone"™ (manufacturer: UCC) or under the name "Placcel"™ (manufacturer: Daicel).

Polycaprolactone triols with molar masses of from 200 to 2,000 g/mol and polycaprolactone diols with molar masses of from 300 to 2,000 g/mol are preferably used as polyester polyols.

The use of polycarbonate polyols as constituent (C) leads to hardened masses with a reduced water absorbency.

Polycarbonate diols with molar masses of from 400 to 2,000 g/mol of the general formula are preferably used, in which X and Y, which can be the same or different, signify, independently of each other, alkylene, arylene, alkarylene, aralkylene or polyoxyalkylene, and n has a value of between 1 and 50, preferably between 1 and 20.

The polybutadiene diols which can be used as constituent (C) represent homopolymers of butadiene, which terminate in OH groups, have molar masses of from 500 to 5,000 g/mol and have a high content of double bonds with a distribution—depending upon the conditions of preparation—between trans-vinylene, cis-vinylene and vinyl groups. Typical representatives of this class of compounds are available commercially under the name "Poly bd"™ (manufacturer: Atochem). Polybutadiene diols, which have centrally located aliphatic epoxy groups and epoxyequivalent masses of from 200 to 1,000 g/mol, preferably from 250 to 600 g/mol, are obtainable by partial epoxidation of the double bonds and preferably of the vinyl groups.

Ethoxy or propoxy-extended bisphenols such as bisphenol A or bisphenol F, dihydroxynaphthalines or dihydroxybenzenes can be used as alkoxy-extended hydroxyaromatic compounds. Typical representatives of this class of compounds are available commercially under the name "Dianol"™ (manufacturer: AKZO).

In order to set the characteristic profile of the masses according to the invention it may be advantageous to use polyols of differing average molar mass and differing structure for the flexibilization; in this way it is possible to set, for example, the degree of flexibilization, the reactivity, the viscosity and the flow behaviour.

The compounds which release radicals when heated (constituent (D)) must be selected from the compounds known per se to the person skilled in the art which have a half-life of one hour at a temperature of less than 100° C., preferably of less than 80° C., so that the short hardening times and low hardening temperatures required for the technical applications of the masses according to the invention may be achieved. The term "half-life" is to be understood as being the time in which half the original quantity of the compound, which releases radicals when heated, disintegrates at a specified temperature. Compounds of this type are for example azo compounds, per-acid esters or peroxides. Peroxides or peroxo compounds are preferred, such as for example diaryl peroxides, peroxydicarbonates, alkyl peresters, perketals, dialkyl peroxides, hydroperoxides or inorganic peroxides. Alkyl peresters such as for example tert-butylperoxyneodecanoate, are preferred. Typical representatives of these peroxides are available commercially under the name "Interox"™ (manufacturer: Peroxid-Chemie GmbH) or under the name "Peroxan"™ (manufacturer: Pergan GmbH). The quantity of the compound or compounds releasing radicals when heated preferably amounts to from 0.01 to 10% by weight, in particular preferably from 0.1 to 3.0% by weight, with respect to the total mass in each case.

The constituent (E), i.e. photo-initiators for the radical polymerization of photo-sensitizing agents for diaryliodonium salts, makes it possible for the compounds—which otherwise harden photochemically only with UVC radiation (200 to 280 nm)—to be hardened even with light of a longer wavelength. All compounds are suitable for this which form radicals after a reaction of the type Norrish I or Norrish II under the action of electromagnetic radiation of a corresponding wavelength. Hydroxyphenyl ketones, benzil ketals, benzoin ethers, monoacylphosphinoxides, bisacylphosphinoxides and α-diketeones may be named as examples. Hydroxyphenyl ketones are preferably used, and 2-hydroxy-2,2-dimethylacetophenone is particularly preferred. Typical representatives of these compounds are available commercially under the names "Irgacure"™ and "Darocure"™ (manufacturer: Ciba-Geigy) or under the name "Lucirin"™ (manufacturer: BASF). The photo-initiator for the radical polymerization preferably absorbs light in the range of a wavelength of from 320 to 500 nm.

Instead of a photo-initiator forming radicals under the action of light, it is possible to use a photo-sensitizing agent for diaryliodonium salts, in order to achieve a photochemical hardening of the masses with radiation of a longer wavelength than UVC radiation has. Examples of suitable photo-sensitizing agents are anthracene, perylene, phenothiazine, xanthone and thioxanthone. In addition, it is possible to use any substances which after photochemical excitation can transmit sufficient energy to the diaryliodonium salt to result in disintegration of the said salt. The quantity of the constituent (E) is in the range of from 0.001 to 10%, depending upon the total mass.

The modifiers (constituent(F)) used can be in the form of fillers, for example quartz powder, silicates, glass powder, as well as dyes and pigments, for example metallic powders or ceramic powders, stabilizers, such as for example inhibited phenols and inhibited amines, phosphites and thioethers or triazines as radical collectors, and also weakly basic substances, for example amines or carboxylates as acid collectors, as well as thixotropifying agents and thickening agents. Initiators, flow promoters and diluents can be added, alone or in combination with one another or in combination with the above-mentioned modifiers, as further modifier groups to the masses according to the invention.

Advantageous embodiments of the process according to the invention are wherein a complete thermal hardening of the polymer masses takes place within at most 15 minutes at 120° C., or in that a complete thermal hardening of the polymer masses takes place in less than 5 minutes at 110° C. The invention also, however, covers those processes in which the thermal hardening lasts longer than 15 minutes, but then, however, in each case at temperatures lower than 120° C., for example at a temperature of between 80 and 100° C.

According to the invention, a process for hardening a polymeric adhesive, casting, sealing or coating mass in shadowed zones inaccessible to radiation is particularly preferred, in which the light-accessible areas of a cationically hardening single-component mass according to the invention are first irradiated with light of a wavelength of from 200 to 600 nm or are exposed to such a light, and after that the entire mass is heated to at most 120° C. in order to harden the shadowed zones inaccessible to radiation.

The masses described are characterized by an excellent storage capacity of for example several months at a temperature of between 4 and 8° C. or of several weeks at room temperature. At the same time, the masses according to the invention have low hardening temperatures and short hardening times, for example 2 minutes at 110° C. As compared with the known masses of the prior art it was possible for the difference between the storage temperature and the hardening temperature to be reduced. This simplifies the use of the masses according to the invention in industrial processes in which a low-temperature storage of the masses is not desired and at the same time short hardening times and low hardening temperatures are required. According to the invention, therefore, both the energy consumption and the time required for the joining process become more advantageous.

In the case of a preferred use of the masses according to the invention, a rapid surface-hardening and fixing of the joined parts to be secured by adhesion or to be cast is achieved by irradiation with light of a wavelength of between 200 and 600 nm, and then the mass remaining as fluid in shadowed zones is hardened by means of heating. In this case, the manner in which the masses are heated and the hardening temperatures are achieved is unimportant. As well as conventional heating furnaces, infrared radiation or microwaves for example are also suitable for heating.

Figure 1:
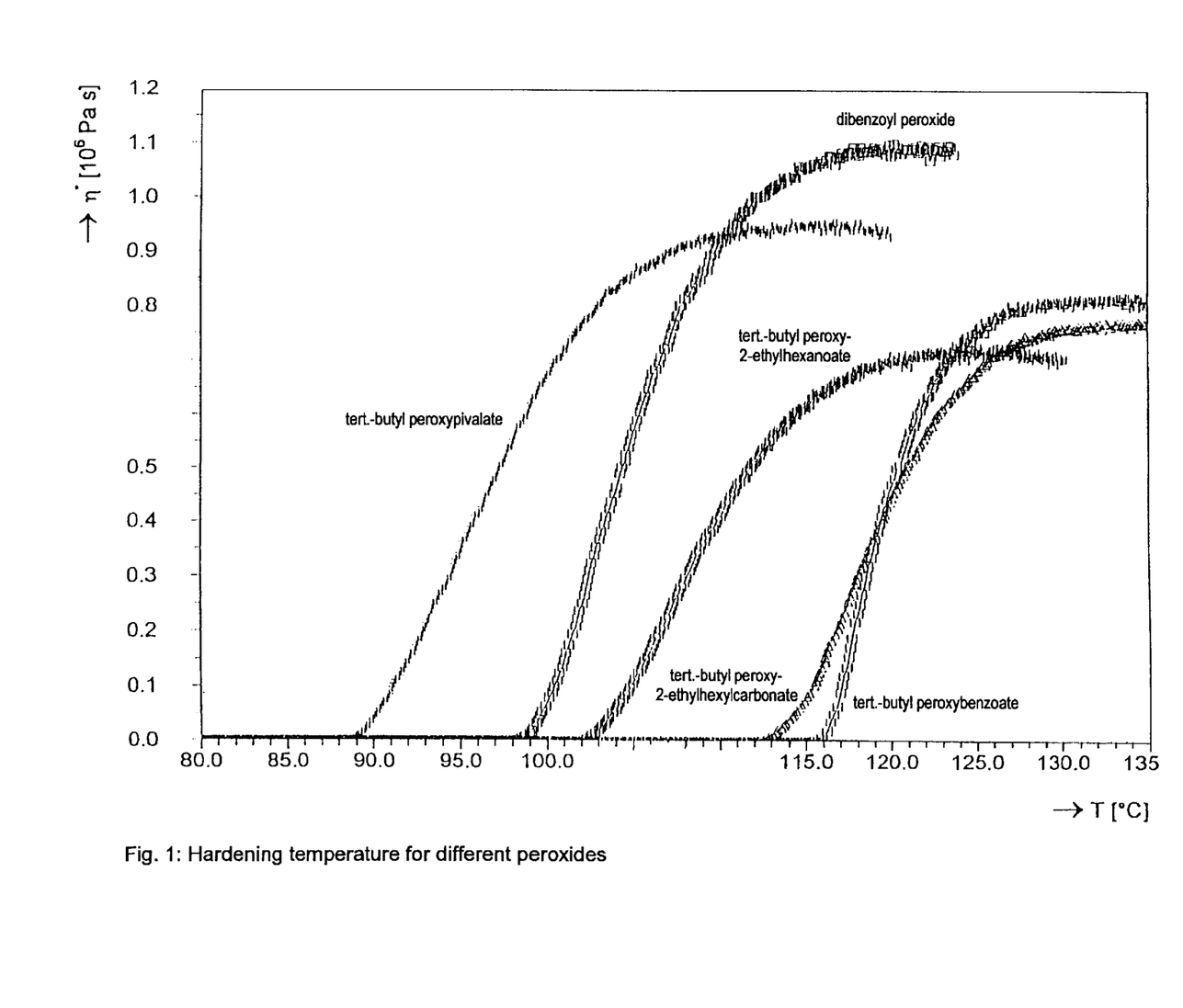
Fig. 1: Hardening temperature for different peroxides

The invention is explained with reference to the following, non-limiting Examples:

measured in MPas, which is determined in the oscillation mode of the rheometer. The temperature T, at which the viscosity increases, is established as the hardening temperature. This temperature may still not be reached in the case of application, since polymerization takes place with a certain time delay (vide also Examples 2 and 3). Because of the temperature gradient used, a higher temperature is achieved during this delay than is in fact necessary for the beginning of polymerization. FIG. 1 shows the hardening pattern—determined by means of a rheometer—of the reaction mixture for the different peroxides as a function of the temperature.

In order to be able to make statements about the storage stability, both the basic viscosity and the reactivity of the respective mixtures are checked at an interval of a month by means of rheometers. The storage stabilities set out in Table 1 are to be understood as minimum values, since, in addition, stabilizers for the cationic polymerization, for example amine compounds, can still be added to the ingredients.

TABLE 1

Hardening temperatures when different periodes are used

| Peroxide | manufacturer | % by weight of peroxide | % by weight of reaction mixture | hardening temperature | storage stability at 8° C. |
|---|---|---|---|---|---|
| tert.-butyl peroxypivalate, solution 75% in aliphatics | Peroxid Chemie | 0.7 | 99.3 | 90° C. | 3 months |
| dibenzoyl peroxide, phlegmatized | Pergan | 1.0 | 99.0 | 100° C. | 6 months |
| tert.-butyl peroxy-2-ethylhexanoate | Peroxid Chemie | 0.5 | 99.5 | 104° C. | 6 months |
| tert.-butyl peroxy-2-ethylhexyl-carbonate | Pergan | 0.5 | 99.5 | 114° C. | 9 months |
| tert.-butyl peroxybenzoate | Peroxid Chemie | 0.5 | 99.5 | 117° C. | 9 months |

EXAMPLE 1

The peroxides listed in Table 1 are added to a reaction mixture which is formed by the following constituents:

54.1% of a cycloaliphatic diepoxy resin (Uvacure™ 1500 of UCB), 0.3% of a diaryliodonium salt (Rhodorsil™ photo-initiator 2074 of Rhone-Poulenc), 45.5% of compounds containing hydroxy groups (43% Tone™ 305 of Union Carbide and 2.5% DIOL 6000 of the firm ESPE), 0.09% of a radical photo-initiator (Darocure™ 1173 of Ciba-Geigy) and 0.01% of a stabilizer based on a phenol (Ralox™ BHT of Raschig). The components are mixed on a dissolver, in which case after the addition of the photo-initiator Darocure™ 1173 it is necessary to work with the exclusion of light of a wavelength of less than 600 nm. Storage takes place in light-impermeable packing drums.

In order to determine the hardening temperature as a function of the peroxide added, the change in viscosity at a defined temperature increase of 2° C. per minute is established with the aid of a rheometer of the firm Bohlin Instruments (INT CVO 75). For this purpose, the cationically hardening mass is applied between two plates (diameter of the upper plate 9 mm) with a gap of 0.1 mm. The quantity to be measured is the complex viscosity η*,

EXAMPLE 2

In order to establish the maximum hardening duration, thermosetting masses with different cationically polymerizable resins are hardened isothermally on a rheometer. The constituents of these masses are:

53.4% (difunctional epoxy resin) or 96.4% (divinyl ether) of a cationically polymerizable compound in accordance with Table 2, 0.3% of a diaryliodonium salt (Rhodorsil™ photo-initiator 2074 of Rhone-Poulenc), 45.5% of compounds containing hydroxy groups (43% Tone™ 305 of Union Carbide and 2.5% DIOL 6000 of the firm ESPE) or in the case of divinyl ether as the cationically polymerizable compound 2.5% of a compound containing hydroxy groups (DIOL 6000 of the firm ESPE), 0.7% tert-butyl peroxypivalate, solution 75% in aliphatic compounds of Peroxide-Chemie, 0.09% of a radical photo-initiator (Darocure™ 1173 of Ciba-Geigy) and 0.01% of a stabilizer based on a phenol (Ralox™ BHT of Raschig). The treatment corresponds to that of Example 1.

Figure 2:
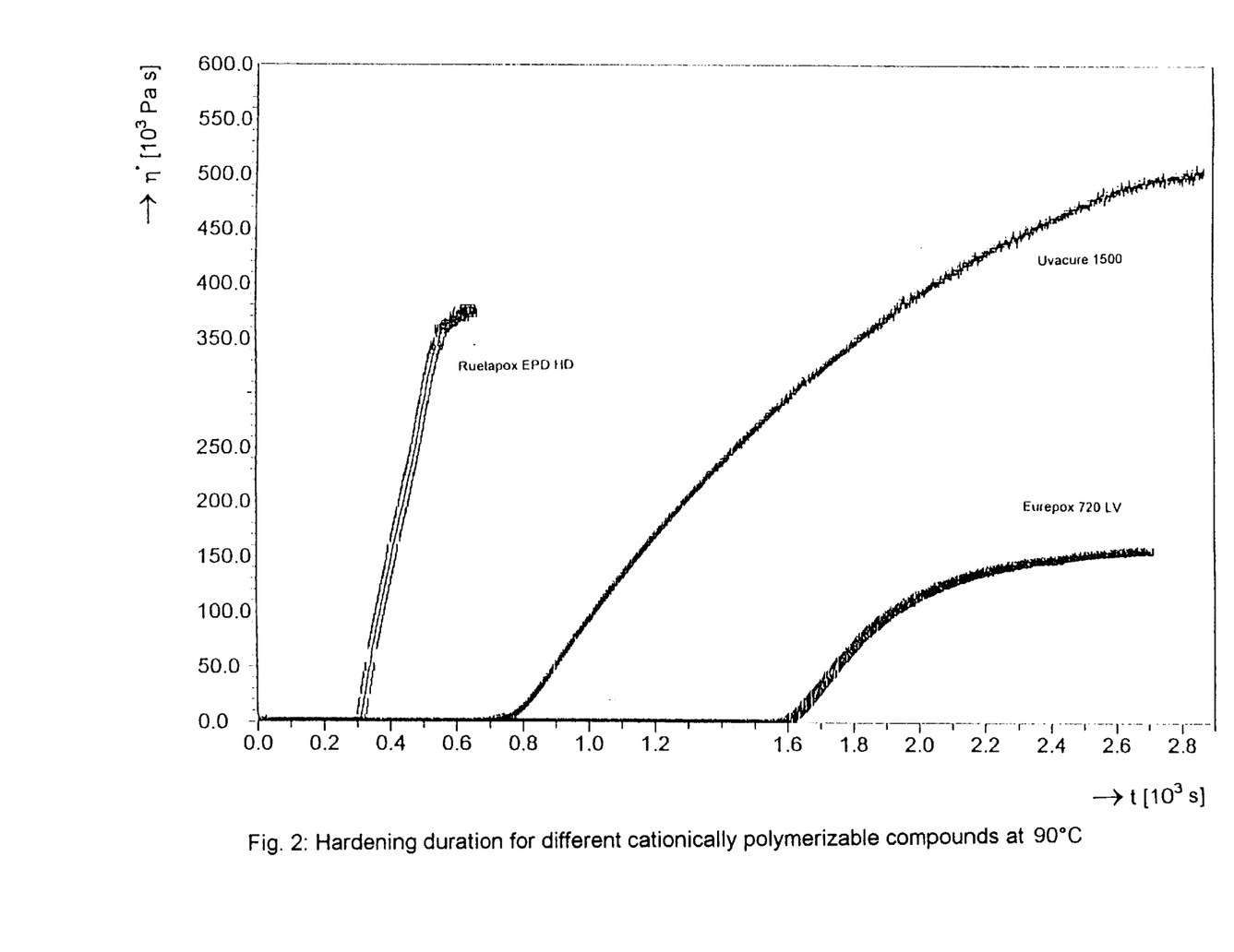
Fig. 2: Hardening duration for different cationically polymerizable compounds at 90°C
Figure 3:
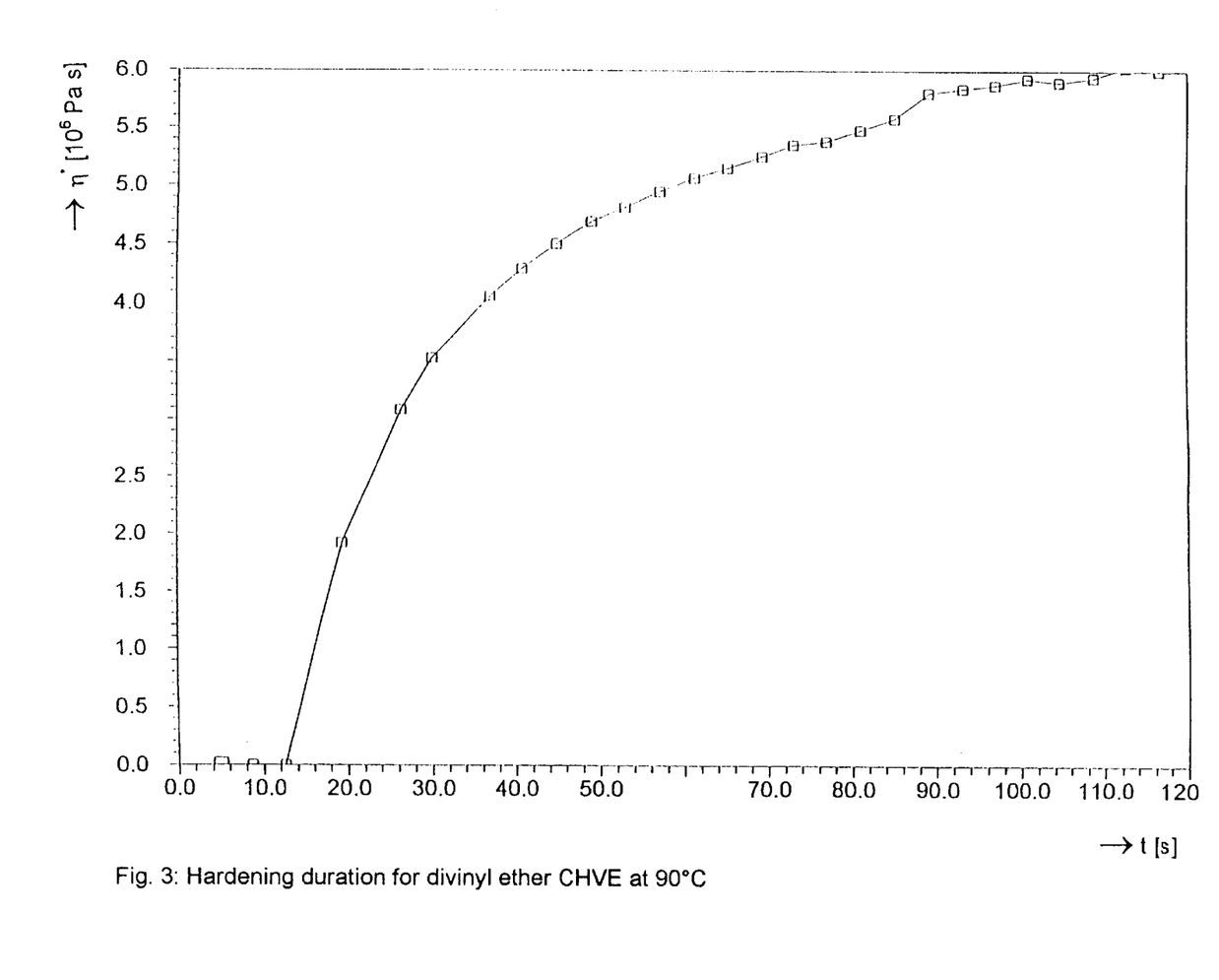
Fig. 3: Hardening duration for divinyl ether CHVE at 90°C
Figure 4:
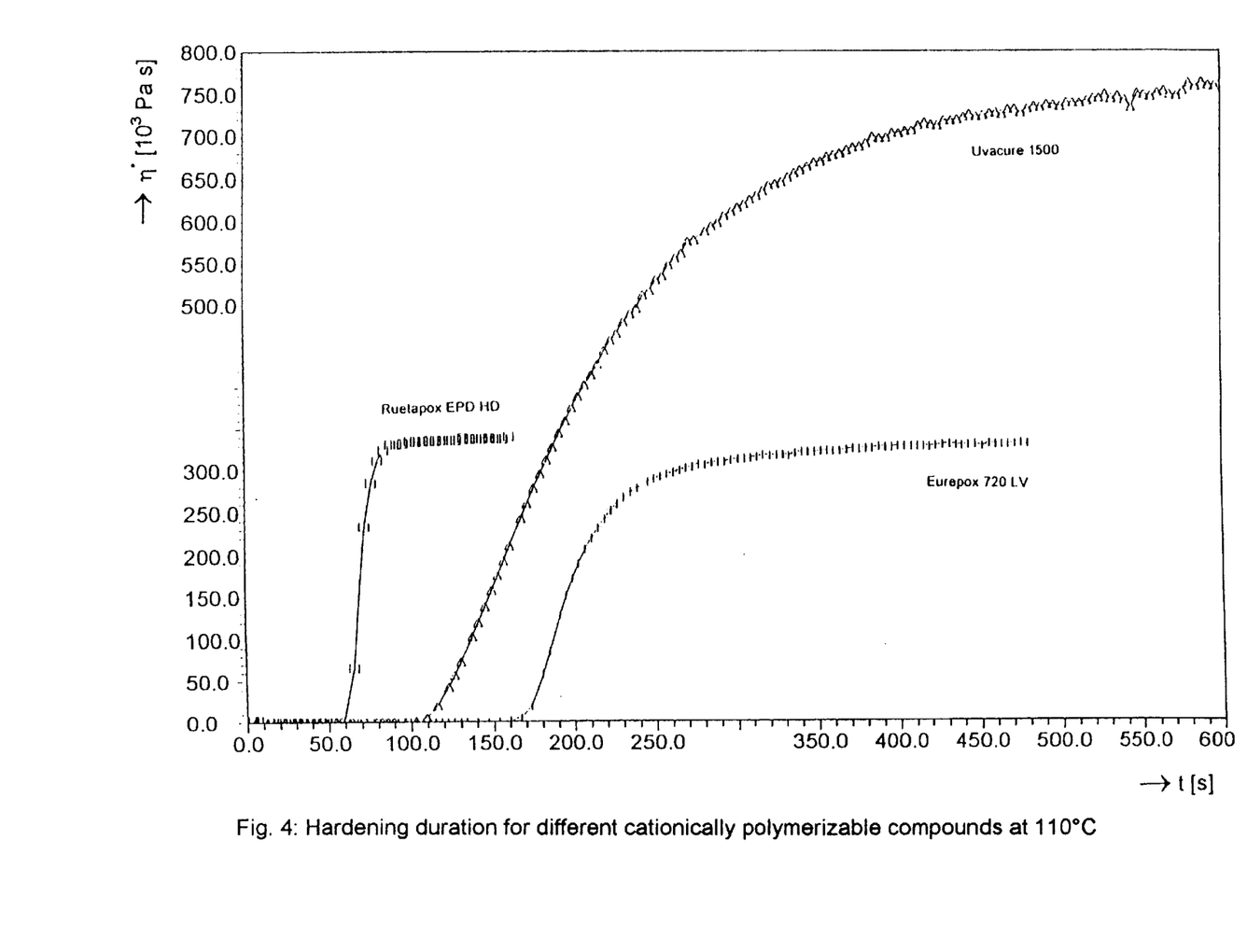
Fig. 4: Hardening duration for different cationically polymerizable compounds at 110°C
Figure 5:
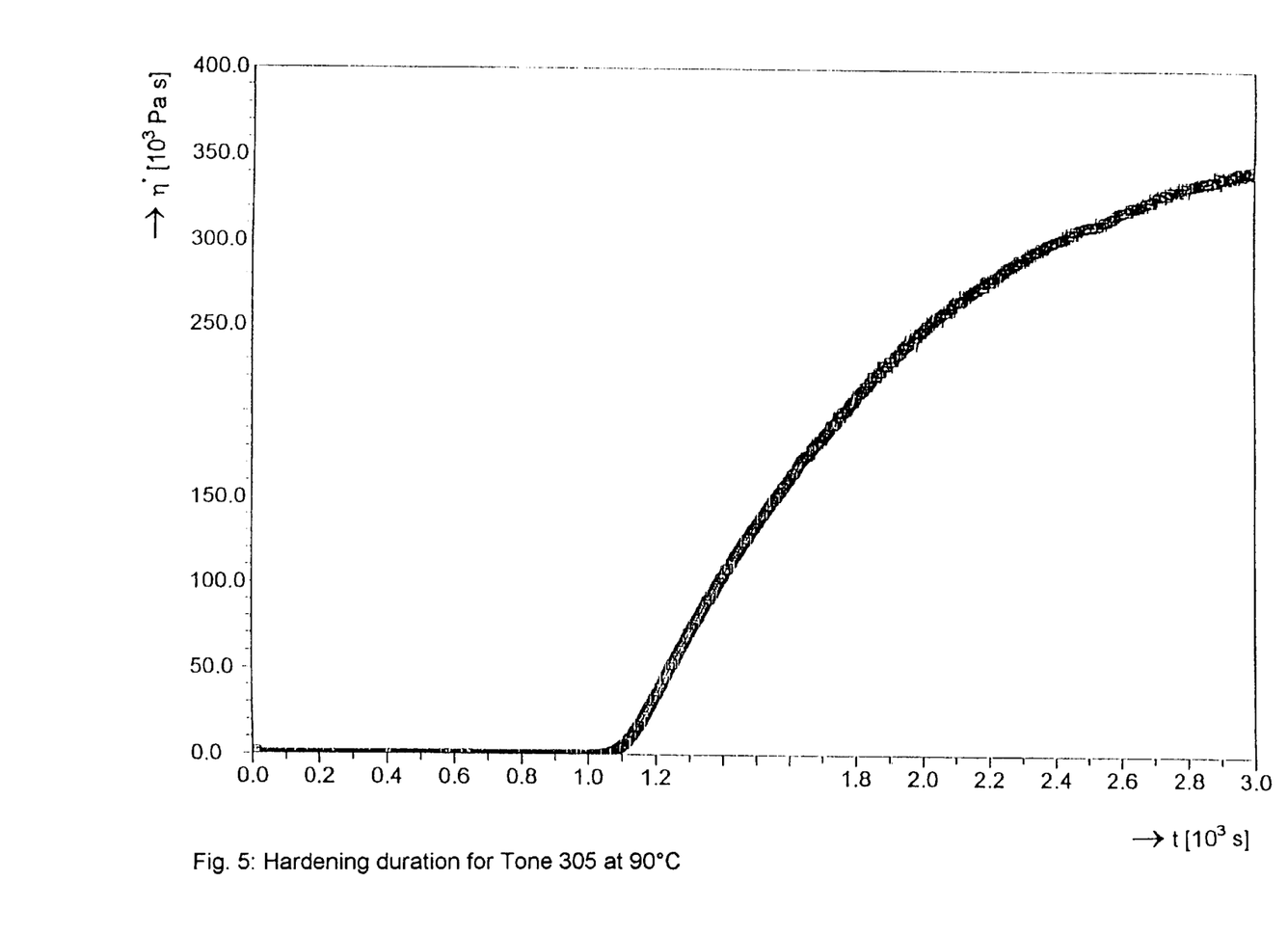
Fig. 5: Hardening duration for Tone 305 at 90°C
Figure 6:
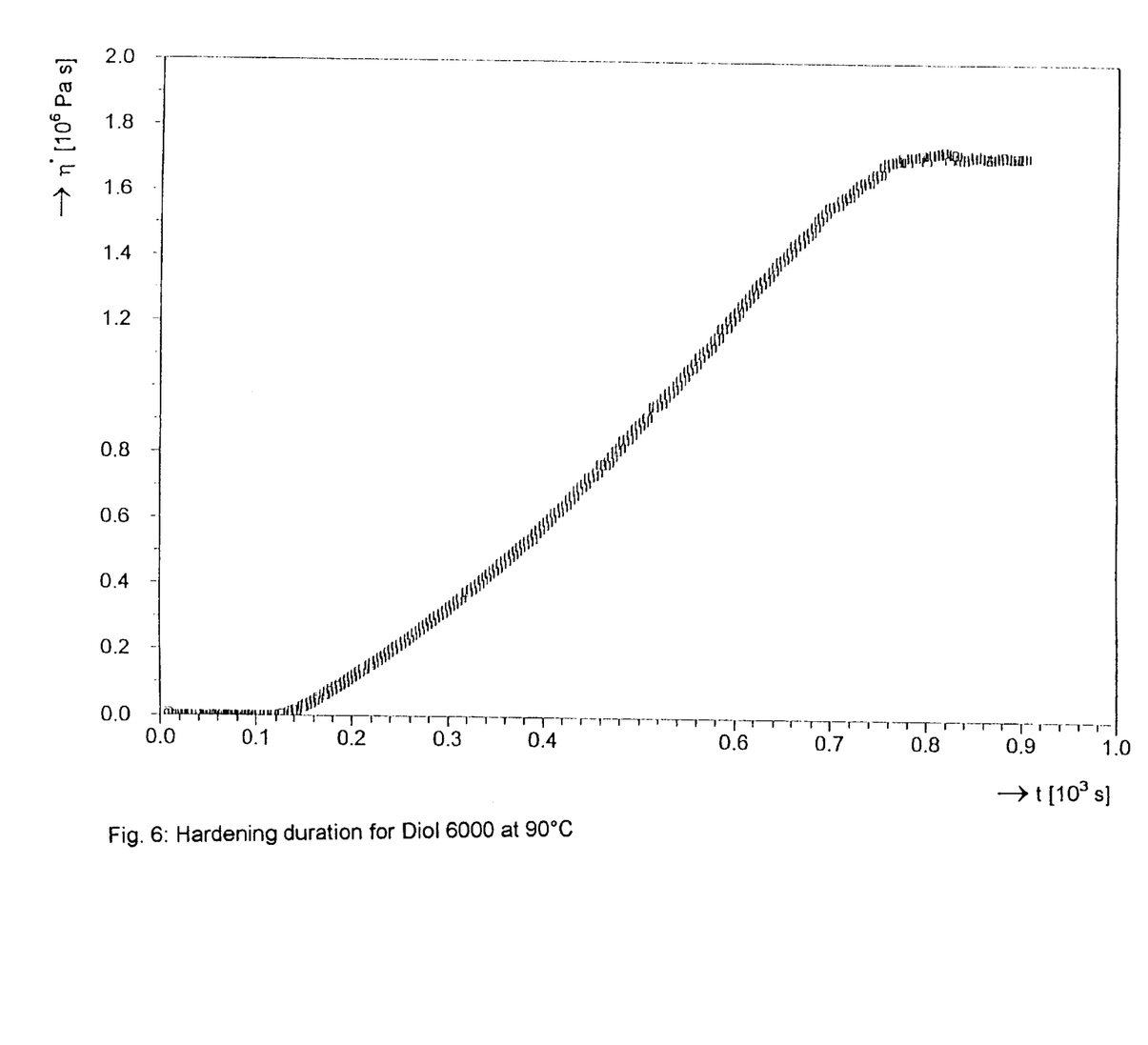
Fig. 6: Hardening duration for Diol 6000 at 90°C
Figure 7:
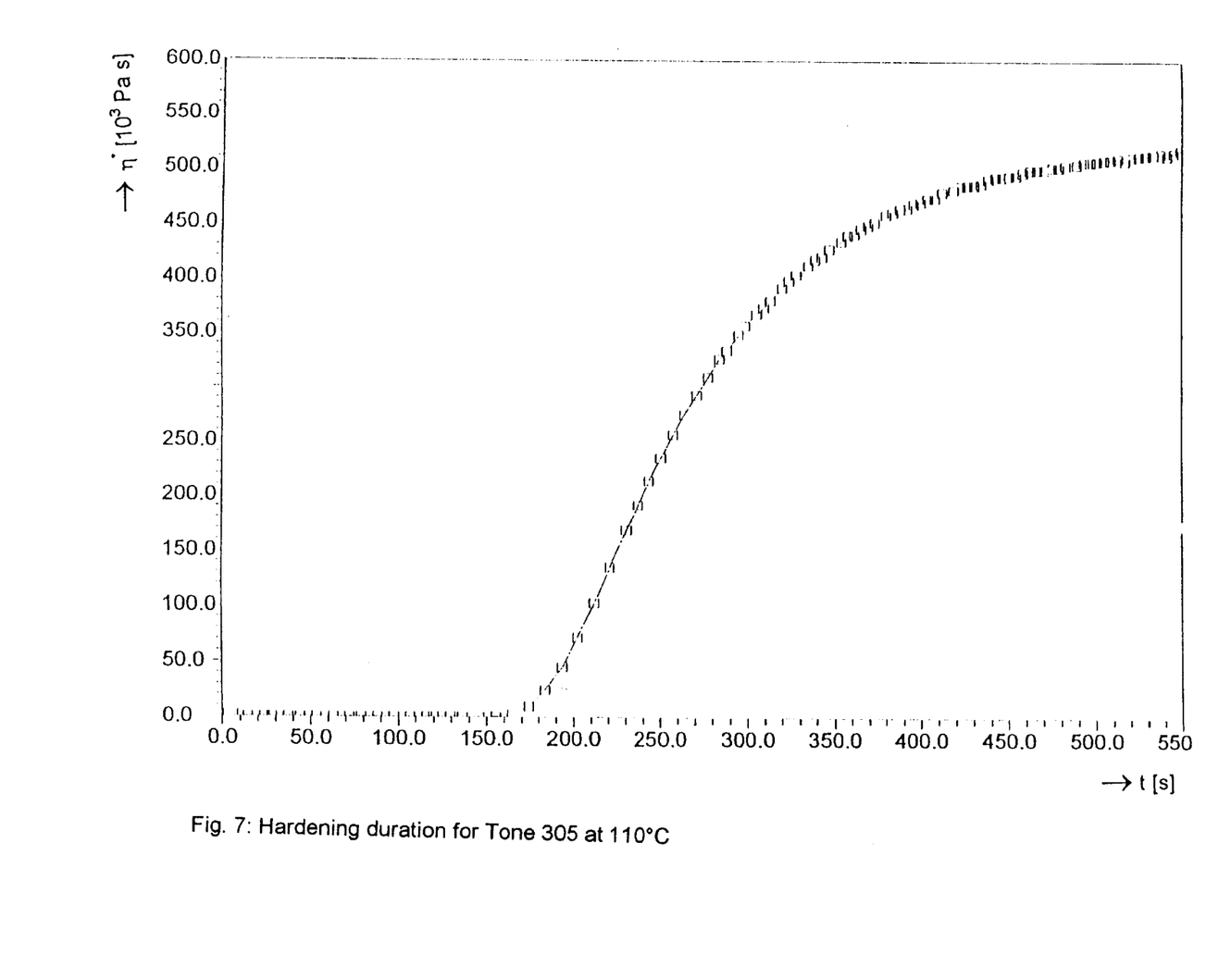
Fig. 7: Hardening duration for Tone 305 at 110°C
Figure 8:
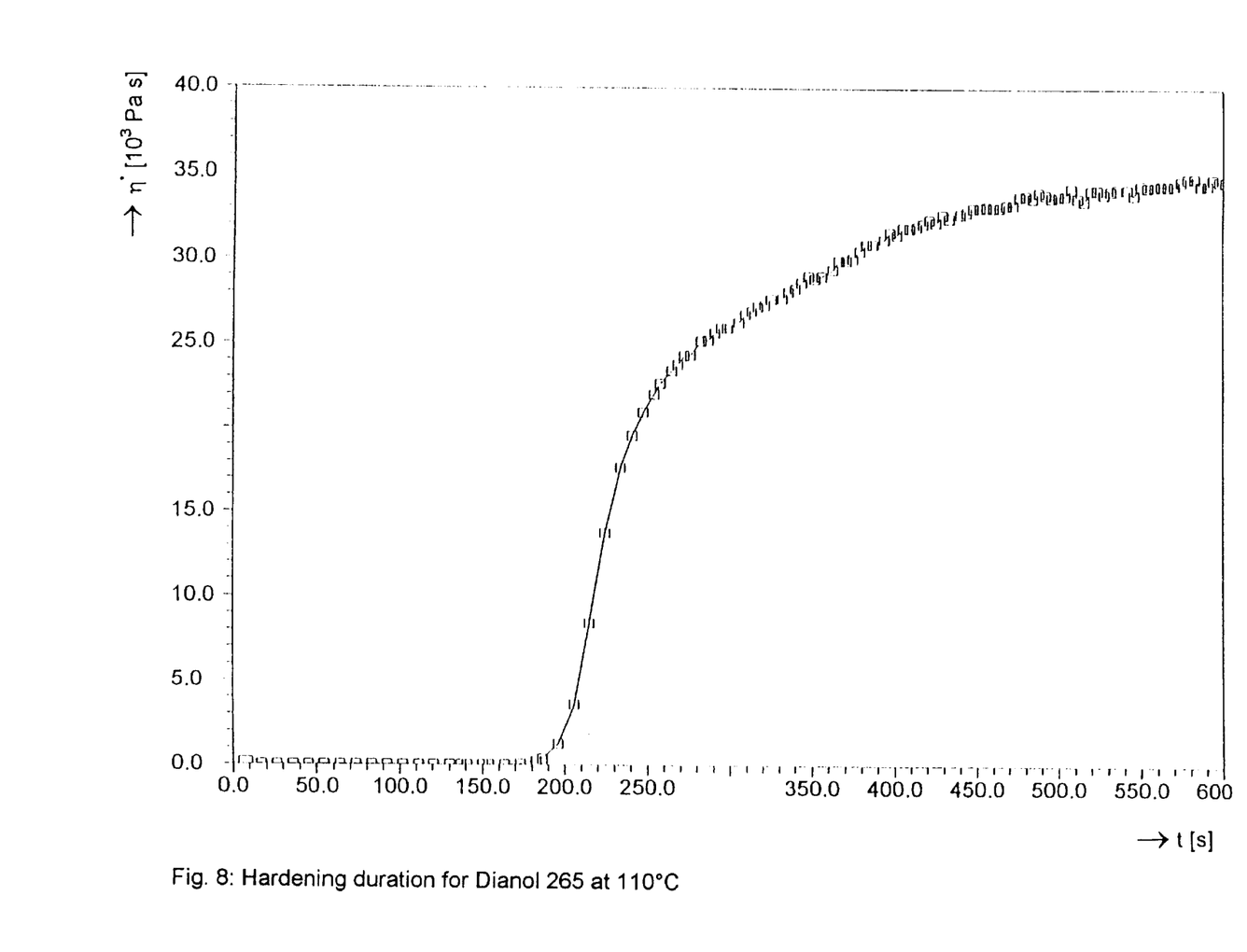
Fig. 8: Hardening duration for Dianol 265 at 110°C
Figure 9:
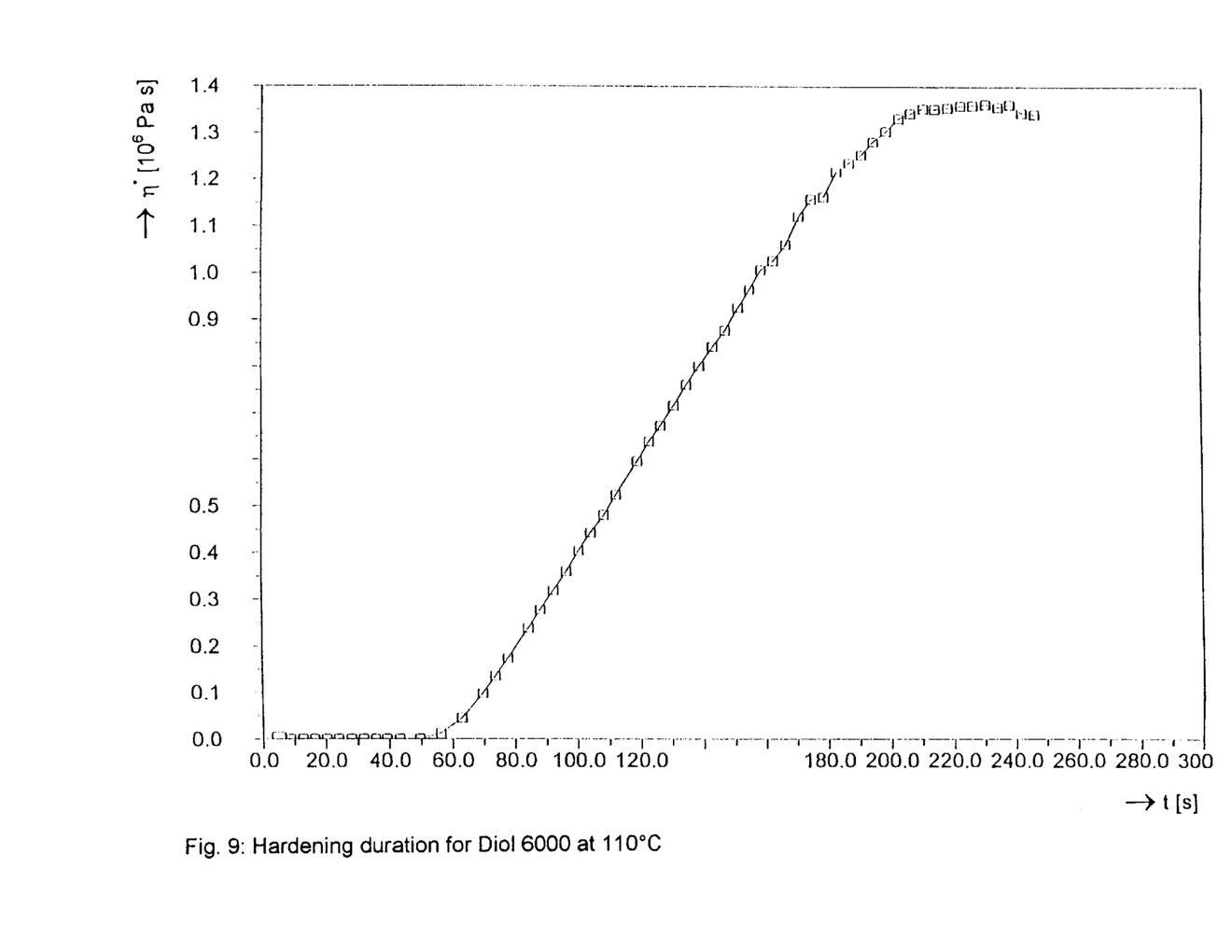
Fig. 9: Hardening duration for Diol 6000 at 110°C

The cationically polymerizable resins used and the hardening times achievable are listed in Table 2. The duration of hardening is defined as being the moment at which 90% of the plateau value of the viscosity is achieved. FIGS. 2 to 4 show the associated hardening curves measured on the rheometer for 90° C. and 110° C.

TABLE 2

Duration of hardening for different cationically polymerizable compounds

| Cationically polymerizable resin | manufacturer | duration of hardening at 90° C. | duration of hardening at 110° C. |
|---|---|---|---|
| aromatic diepoxy resin Eurepox ™ 720 LV | Witco Surfactants | 40 min | 5 min |
| cycloaliphatic diepoxy resin Uvacure ™ 1500 | UCB | 45 min | 6 min |
| aliphatic diepoxy resin Ruetapox ™ EPD HD | Bakelite AG | 9 min | 80 sec |
| divinyl ether CHVE | ISP Europe | 90 sec | too reactive |

EXAMPLE 3

The duration of hardening is determined rheometrically in a manner similar to Example 2 as a function of different compounds containing hydroxy groups. The cationically polymerizable mass consists of 53.4% of a cycloaliphatic diepoxy resin (Uvacure™ 1500 of UCB), 0.3% of a diaryliodonium salt (Rhodorsil™ photo-initiator 2074 of Rhone-Poulenc), 45.5% of a compound containing hydroxy groups in accordance with Table 3, 0.7% of tert.-butyl peroxypivalate, solution 75% in aliphatic compounds of Peroxid-Chemie, 0.09% of a radical photo-initiator (Darocure™ 1173 of Ciba-Geigy) and 0.01% of a stabilizer based on a phenol (Ralox™ BHT of Raschig). The treatment corresponds to that of Example 1.

FIGS. 5 to 9 show the associated hardening curves measured on the rheometer for 90° C. and 110° C.

TABLE 3

Duration of hardening for different compounds containing hydroxy groups

| Compound containing hydroxy groups | manufacturer | duration of hardening at 90° C. | duration of hardening at 110° C. |
|---|---|---|---|
| Toner ™ 305 | Union Carbide | 45 min | 6 min |
| Dianol ™ 265 | Akzo Nobel | no hardening within 1 h | 7 min |
| DIOL 6000 | ESPE | 12 min | 3 min |

EXAMPLE 4

The cohesion and the elongation at tear of test samples of a cationically polymerizable mass hardened to different degrees in accordance with Example 1 is determioned with 1.0% dibenzoyl peroxide. The following hardening conditions were selected:

Photo-hardening, 30 sec under an LUX 03 lamp of the firm DELO (UV-A/VIS-radiator), power 50 mW/cm$^2$ thermal hardening 110° C., 45 min combinations of photo- and thermal hardening with the parameters set out above, the tests samples being stored for two hours in the dark at room temperature between the two hardening processes, or combination of thermal and photo-hardening, conditions as set out above.

The test samples, which were stored in the dark for 16 hours at room temperature after hardening, have a cross-section of 2×2 mm and a length between the retaining clamps of the tensile-testing machine of 20 mm. The measurement took place on a tensile-testing machine of the firm Zwick (ZWICK 1466) until the material failure of the test samples, 30 mm/min being selected as the rate of advance of the tension/shear stress. The results in Table 4 show that the state of hardening is determined by the hardening variant first selected, but only in the light/heat combination does a slight reduction in the elongation at tear become evident. In general, values for cohesion and the elongation at tear which are lower by from 25 to 30% are achieved during the thermal hardening.

TABLE 4

Cohesion and elongation at tear for different hardening conditions

| Hardening condition | cohesion in MPa | elongation at tear in % |
|---|---|---|
| light | 29.8 ± 3.8 | 111.7 ± 12.7 |
| heat | 21.8 ± 2.8 | 72.1 ± 9.5 |
| light/heat | 29.6 ± 3.2 | 99.2 ± 6.4 |
| heat/light | 21.1 ± 1.5 | 72.7 ± 5.5 |

What is claimed is:

1. A cationically hardenable composition comprising, in combination:
    (A) from 5 to 90 parts by mass of at least one at least difunctional cationically polymerizable compound;
    (B) from 0.01 to 5 parts by mass of a diaryliodonium salt as a photo-initiator for cationic hardening;
    (C) from 0.1 to 70 parts by mass of at least one compound containing a hydroxyl group and having a molar mass of from 150 to 10,000 g/mol and hydroxy-equivalent masses of from 50 to 5,000 g/mol;
    (D) from 0.01 to 10 parts by mass of a compound releasing radicals when heated and having a half-life of one hour at a temperature of less than 100° C.;
    (E) from 0.001 to 10 parts by mass of a photo-initiator forming radicals or of a photo-sensitizing agent for diaryliodonium salts; and
    (F) from 0 to 60 parts by mass of modifiers, selected from the group consisting of a filler, a dye, a pigment, a stabilizer, an accelerator, a retardant, an initiator, a flow promoter, a thixotropic agent, a diluent, a polymeric thickening agent, and a mixture thereof, with the sum of all the parts by mass amounting to 100 and all the constituents (A) to (F) of the cationically hardenable composition being present in the form of a single-component mixture capable of being stored in a stable manner and with the cationically hardenable composition being completely hardenable when light-initiated and/or heat-initiated.

2. The composition of claim 1, wherein at least one of the at least difunctional cationically polymerizable compounds is a diepoxide.

3. The composition of claim 2, wherein at least one of the at least difunctional cationically polymerizable compounds is a cycloaliphatic diepoxide.

4. The composition of claim 3, wherein at least one of the at least difunctional cationically polymerizable compounds is 3,4-epoxycyclohexylmethyl-3',4'-epoxycyclohexylcarboxylate.

5. The composition of claim 1, wherein the diaryliodonium salt contains an anion having a nucleophilicity lower than the nucleophilicity of an $SbF_6$ anion.

6. The composition of claim 1, wherein the compound containing an hydroxyl group is selected from the group consisting of a polyester polyol, a polyether polyol, a polycarbonate polyol, a polybutadiene polyol and an alkoxy-extended hydroxy aromatic compound.

7. The composition of claim 1, wherein the compound releasing radicals when heated is a peroxo compound.

8. The composition of claim 7, wherein the peroxo compound has a half-life of one hour at a temperature of less than 80° C.

9. The composition of claim 1, wherein the photo-initiator forming radicals absorbs light in the range of a wavelength of from 320 to 500 nm.

10. A method for bonding, casting, sealing and coating of substrates which comprises applying the cationically hardenable composition of claim 1 to the substrates and hardening the composition.

11. The method of claim 10 wherein the substrates are electronic components.

12. A process for preparing a cationically polymerized product, wherein a cationically hardenable single-component composition according to claim 1 is hardened under the action of light of a wavelength of from 200 to 600 nm and/or with the application of heat, with said cationically hardening composition being heated to at most 120° C.

13. The process of claim 12, wherein a complete thermal hardening of the polymer composition takes place within at most 15 minutes at 120° C.

14. The process of claim 12, wherein a complete thermal hardening of the polymer composition takes place in less than 5 minutes at 110° C.

15. A process for hardening a polymeric adhesive, casting, sealing or coating composition in shadowed zones inaccessible to radiation, wherein the light-accessible areas of a cationically hardenable single-component composition according to claim 1 are first irradiated with light of a wavelength of from 200 to 600 nm or are exposed to such a light, and after that the entire composition is heated to at most 120° C. in order to harden the zones inaccessible to radiation.

* * * * *